United States Patent
Prassas et al.

(10) Patent No.: US 6,944,192 B2
(45) Date of Patent: Sep. 13, 2005

(54) PLANAR LASER

(75) Inventors: Michel Prassas, Vulaines sur Sein (FR); Luis A. Zenteno, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 153 days.

(21) Appl. No.: 10/456,663

(22) Filed: Jun. 6, 2003

(65) Prior Publication Data

US 2003/0210725 A1 Nov. 13, 2003

Related U.S. Application Data

(63) Continuation-in-part of application No. 09/968,354, filed on Sep. 27, 2001, now Pat. No. 6,751,241, and a continuation-in-part of application No. 09/808,270, filed on Mar. 14, 2001, now Pat. No. 6,836,607.

(51) Int. Cl.[7] .................................................. H01S 3/30
(52) U.S. Cl. ............................. 372/6; 372/64; 372/68; 385/16; 385/28
(58) Field of Search ........................... 372/6, 64, 68, 372/66; 385/16, 28

(56) References Cited

U.S. PATENT DOCUMENTS

| | | | |
|---|---|---|---|
| 3,845,413 A | * 10/1974 | Chiron et al. ................. 333/1.1 |
| 5,260,822 A | 11/1993 | Missagia et al. ............. 359/337 |
| 5,400,353 A | 3/1995 | Walpole et al. ................ 372/46 |
| 5,513,196 A | 4/1996 | Bichel et al. .................. 372/22 |
| 5,517,517 A | 5/1996 | Liou ............................. 372/50 |
| 6,043,929 A | 3/2000 | Delavaux ..................... 359/337 |
| 6,073,465 A | * 6/2000 | Oleskevich et al. ........... 65/390 |
| 6,174,748 B1 | 1/2001 | Jeon et al. ..................... 438/31 |
| RE37,354 E | 9/2001 | Welch et al. .................. 372/50 |
| 6,301,408 B1 | 10/2001 | Espindola et al. ............. 385/37 |
| 6,436,613 B1 | 8/2002 | Fallahi et al. ................ 430/321 |
| 6,529,675 B1 | * 3/2003 | Hayden et al. .............. 385/141 |
| 6,580,850 B1 | * 6/2003 | Kazarinov et al. ............ 385/28 |

FOREIGN PATENT DOCUMENTS

| | | |
|---|---|---|
| WO | WO 99/27619 A2 | 6/1999 |
| WO | WO02/42803 A2 | 5/2002 |
| WO | WO02/42808 A2 | 5/2002 |

* cited by examiner

*Primary Examiner*—Minsun Oh Harvey
*Assistant Examiner*—Dung T. Nguyen
(74) *Attorney, Agent, or Firm*—Juliana Agon

(57) ABSTRACT

An optical device (10) includes a broad area laser (72) for lasing at a first wavelength (64), a multimode active-doped tapered waveguide laser (6); and a multimode passive planar mode transformer (118) coupling and tapering from the broad area laser (72) to the multimode active-doped tapered waveguide laser (6).

20 Claims, 4 Drawing Sheets

PLANAR LASER

CLAIM OF PRIORITY

This is a continuation-in-part of U.S. patent application Ser. No. 09/968,354 filed on Sep. 27, 2001, now U.S. Pat. No. 6,751,241, and of U.S. patent application Ser. No. 09/808,270, filed on Mar. 14, 2001, now U.S. Pat. No. 6,836,607 the content of which are relied upon and incorporated herein by reference in its entirety, and the benefit of priority under 35 U.S.C. § 120 is hereby claimed.

BACKGROUND OF THE INVENTION

1. Field of the Invention

The present invention relates generally to optical devices, and in particular to brightness converters for optical devices.

2. Technical Background

The development of a single transverse mode laser when excited by a gain region that supports the lasing of multiple modes is useful for many different types of applications. The efficient coupling of the output of this laser radiation into single-mode waveguides for subsequent frequency conversion or similar frequency operation is still an area of development.

A single-mode waveguide such as a single-mode optical fiber is the favored transmission medium for telecommunications due to its high capacity and immunity to electrical noise. Single-mode fiber transmission is preferred over multimode fiber because higher-order modes exhibit much greater dispersion (typically the limiting factor for the fiber transmission distance at high data rates). Silica optical fiber is relatively inexpensive, and when fabricated as a single transverse mode fiber can efficiently transmit and otherwise couple signals in the 1550 nm band for many kilometers without amplification or regeneration.

If amplification is needed, erbium-doped fiber amplifiers (EDFAs) have been found quite effective in providing the required optical gain. Another example of an amplifier is a fiber with Raman gain. However, a need still exists for optical amplification and/or optical brightness conversion in many non-telecommunication applications, such as medical, printing, displays, "eye-safe" lasers pumping at a range of about 1480–1550 nm for providing a signal wavelength at 1600 nm, or defensive use of lasers as an optical device.

In search for a high powered laser source for telecommunications or non-telecommunication applications, the broad-area diode laser (BALD) remains the most efficient and least expensive pump source of a multimode pump light. Recent progress in semiconductor laser technology has led to creation of broad-area laser diodes with output powers of up to 16 W. The achievement of high total power in the face of the power density limitation at the facet due to the risk of optical damage requires the use of broad area gain sections with emission facet widths of hundreds of microns. Devices 100 µm (microns) wide with a slow-axis numerical aperture (NA) of less than 0.1 and output power of 4 Watts at 920 and 980 nm are now passing qualification testing for telecommunication applications. With proper coupling optics, the beam of such a laser diode can be focused into a spot as small as 30×5 µm with an NA of less than 0.35 in both transverse directions. The optical power density in such a spot is ~3 MW/cm$^2$, high enough to achieve gain transparency in 3-level laser systems.

One approach for utilizing inexpensive high-power broad-area pump lasers involves cladding-pumped, or double-clad fiber designs for the broad-area optical pump source. The advantages of cladding-pumped fiber lasers are well known. Such a device effectively serves as a brightness converter, converting a significant part of the multimode pump light into a single-mode output at a longer wavelength.

Cladding pumping can be employed to build a separate high-power single mode fiber pump laser. A source based on the pure three-level 978 nm Yb$^{+3}$ transition has long been suggested as a pump for EDFAs because this wavelength is close to the desired pumping wavelength of 980 nm. However, the cladding-pumped technique has been determined in practice to be ineffective for pumping pure three-level lasers, such as the 980 nm transition of ytterbium, because of various laser design parameters that have to be satisfied.

One such laser design parameter is the selection or discrimination of the desired 3-level lasing mode over the harder-to-suppress 4-level mode. Practical double-clad amplifiers and lasers have been mostly limited to 4-level systems. Double-clad fiber lasers offer better performance for four-level lasing (where the lasing occurs in a transition between two excited states) than for the three-level one (where the lasing transition is between the excited and the ground state). For example, for the rare-earth ion, Ytterbium (Yb), the three-level transition is at 978 nm and competing higher-gain four-level transition is at about 1030–1100 nm.

In a double-clad laser, an outer cladding confines the pump light from a primary pump source in a large cross-sectional area multimode inner cladding. The much smaller cross-sectional area core is typically doped with at least one rare-earth ion, for example, neodymium or ytterbium, to provide lasing capability in a single-mode output signal. Typically, a neodymium-doped or ytterbium-doped double-clad fiber is pumped with one or several high-power broad-area diode lasers (at 800 nm or 915 nm) to produce a single transverse mode output (at the neodymium four-level transition of 1060 nm or the ytterbium four level transition of 1030–1120 nm, respectively). Thus, conventional double-clad arrangements facilitate pumping of the fiber using a multimode first cladding for accepting and transferring pump energy to a core along the length of the device. The double-clad laser output can be used to pump a cascaded Raman laser to convert the wavelength to around 1480 nm, which is suitable for pumping erbium.

The amount of pump light that can be coupled into a double-clad fiber inner cladding depends on the cladding size and NA. As is known, the "etendue" (numerical aperture multiplied by the aperture dimension or spot size) of the fiber should be equal to or greater than the etendue of the pump source for efficient coupling. The numerical aperture and spot size may be different in both axes so there may be an etendue in the x and y directions that must be maintained or exceeded.

Typically, a high numerical aperture NA$_{clad}$, related to the difference in refractive index between the first and second cladding is desired. If there are two claddings instead of one, the index of the first cladding is n$_{clad,1}$ and the index of the second cladding is n$_{clad,2}$ such that NA$_{clad}$=(n$_{clad,1}^2$−n$_{clad,2}^2$)$^{1/2}$. In a well-known design, the first clad layer is made of glass and the second is made of plastic (fluorinated polymer) with a relatively low refractive index in order to increase the numerical aperture NA$_{clad}$. Such plastic may not have the desired thermal stability for many applications, may delaminate from the first cladding, and may be susceptible to moisture damage.

In known 3-level double-clad host fibers, the laser cavity is formed by an input dielectric mirror which transmits the 920-nm pump band and reflects the desired 980-nm lasing band. For any input mirror of the fiber laser, it is desirable to reflect only the fundamental mode, at the laser wavelength, e.g., 978 nm, to form the input end of the optical cavity. A dielectric mirror at the end of the double-clad fiber or a weak fiber Bragg grating in the single-mode fiber, e.g., Corning® CS-980 fiber, coupled to the coupling end of the double-clad fiber serves as the output coupler for providing the output end of the cavity.

One of the primary technical challenges in a high power fiber laser is the formation of the input dielectric mirror across the multimode inner cladding of the double-clad fiber. Approaches include attaching a glass micro-sheet to the fiber endface or directly depositing a thin-film dielectric on the fiber endface, but both of these methods present their own technical hurdles.

A tapered fiber laser has also been proposed as an alternate optical pump. This two-stage laser has an optical pump source to provide a pump light at a pump wavelength and a first waveguide portion which when optically pumped at the pump wavelength is capable of lasing with an emission at a lasing wavelength. The first waveguide portion exhibits multi-transverse-mode behavior at the lasing wavelength. A second waveguide portion exhibiting a substantially single transverse mode behavior at the lasing wavelength is optically coupled together with the first waveguide portion. An optical cavity is defined by a multimode grating on the first waveguide portion and a single mode grating on the second waveguide portion and includes the first and second waveguide portions. As an example, the delta index or contrast index of the difference between the cladding refractive index and the multimode core refractive index could be between 0.04 to 0.06 for the low indexed germania (Ge) doped silicates multimode fibers of this approach.

As is known, the terminology "fiber Bragg grating" refers to a grating in which incident light is reflected back along the same fiber by a "short period" (a.k.a. Bragg) grating in the fiber and the fabrication of such gratings is known. Fiber Bragg gratings (FBGs) couple power from one mode to another provided that the propagation constants of the two modes satisfy the following grating equation:

$$\beta_1 - \beta_2 = \frac{2\pi}{\Lambda} \qquad \text{Eq. (1)}$$

where $\beta_1$ and $\beta_2$ are the propagation constants of the two modes, $\Lambda$ is the grating period in the fiber, and first order diffraction is assumed for simplicity. When a forward propagating mode reflects into the identical backwards propagating mode, the Bragg condition becomes $\lambda_B = 2n_{eff}\Lambda$, where $n_{eff}$ is the effective index of the mode ($\beta = (2\pi/\lambda)n_{eff}$) and lies between the core index $n_{core}$ and the cladding index, $n_{clad}$ for guided modes ($n_{clad} < n_{eff} < n_{core}$). Forward propagating modes may also reflect into other modes when mode orthogonality is no longer maintained, for example when UV induced index changes due to the FBG itself perturb the index profile sufficiently. The index profile needed depends on fiber geometry, cladding material, and the exact wavelengths for the particular application.

As with the double-clad fiber laser, to enable the maximum launch of optical power from the high power pump source into the laser cavity of either the double-clad fiber or the tapered fiber laser, the pump needs to have a large numerical aperture (NA) waveguide which is related to the index contrast. However, an increased index delta for providing power enhancement requires more design, testing, and manufacturing complexities to be first solved.

Even though many fiber solutions can be applied to other types of waveguides, such as a planar waveguide, the different trade-offs of planar processing also have to be considered before realizing the final solution. It is known that planar processing of optical integrated circuit enables the production of low cost devices.

Therefore there is a continued need to increase the power output of an optical device, while increasing the reliability and simplifying the packaging and manufacturing of the optical device.

DETAILED DESCRIPTION OF THE PREFERRED EMBODIMENTS

It is to be understood that the following detailed description presents embodiments of the invention, and is intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

Figure 1:
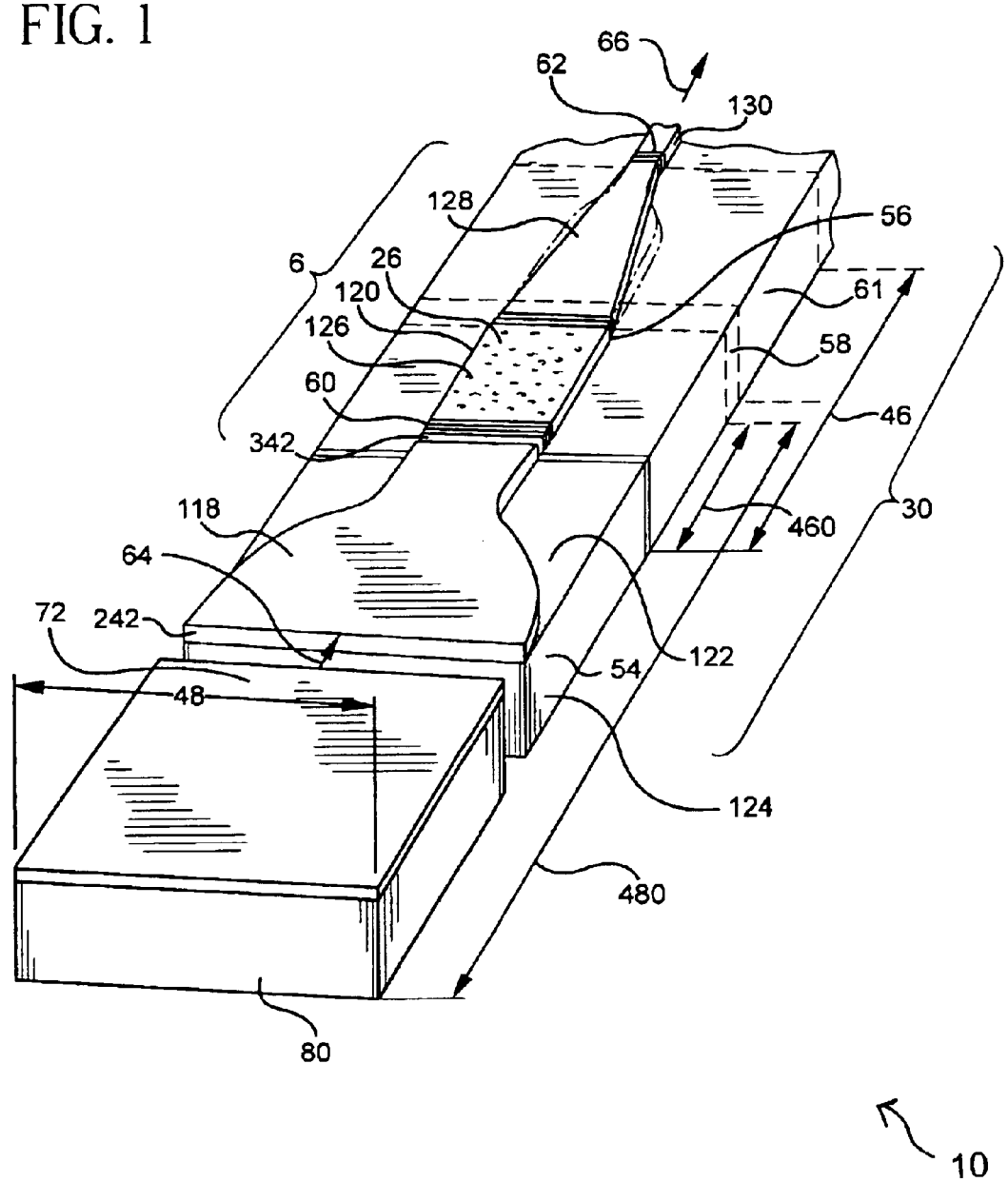
FIG. 1 is a perspective illustration of using an optical device 30, as a doubly-tapered mode-transformed planar embodiment of a waveguide laser, according to the present invention.

The optically-active brightness converter 6 forming a portion of a dielectric waveguide laser 30 for providing an optical device 10 of the present invention is shown in FIG. 1 and is generally described and depicted herein with reference to an exemplary or representative embodiment with the same numbers referenced to the same or functionally similar parts. In general, different design considerations need to be traded-off to provide a high-powered three-level transition waveguide laser, serving as an optical device or source 10 that can be embodied in different ways. One way utilizes the fact that rectangular dielectric waveguides 30 can be formed on planar substrates by techniques similar to those used in semiconductor fabrication or other techniques, such as ion-exchange, pulsed laser deposition (PLD), sputtering, plasma enhanced chemical vapor deposition, flame hydrolysis, and $LiNbO_3$ technology including diffusion doping.

Referring to FIG. 1, a simple tapered brightness converter or waveguide laser 6 and a mode transformer 118 forming the dielectric waveguide laser 30, coupling to a broad area laser 72, to provide an optical device 10, such as a source, for example, is illustrated schematically in an orthographic view. A rib waveguide 120 is formed on the top surface or core 122 of a dielectric substrate or cladding 124 having a lower refractive index than that of the rib waveguide 120. A separate un-illustrated upper cladding may be formed over the rib waveguide 120 or air can serve as the upper cladding. The rib waveguide 120 includes a rectangular doped multimode section 126, an input rectangular tapered section 118, an output rectangular tapered section 128, and a substantially squared single mode section 130.

Figure 4:
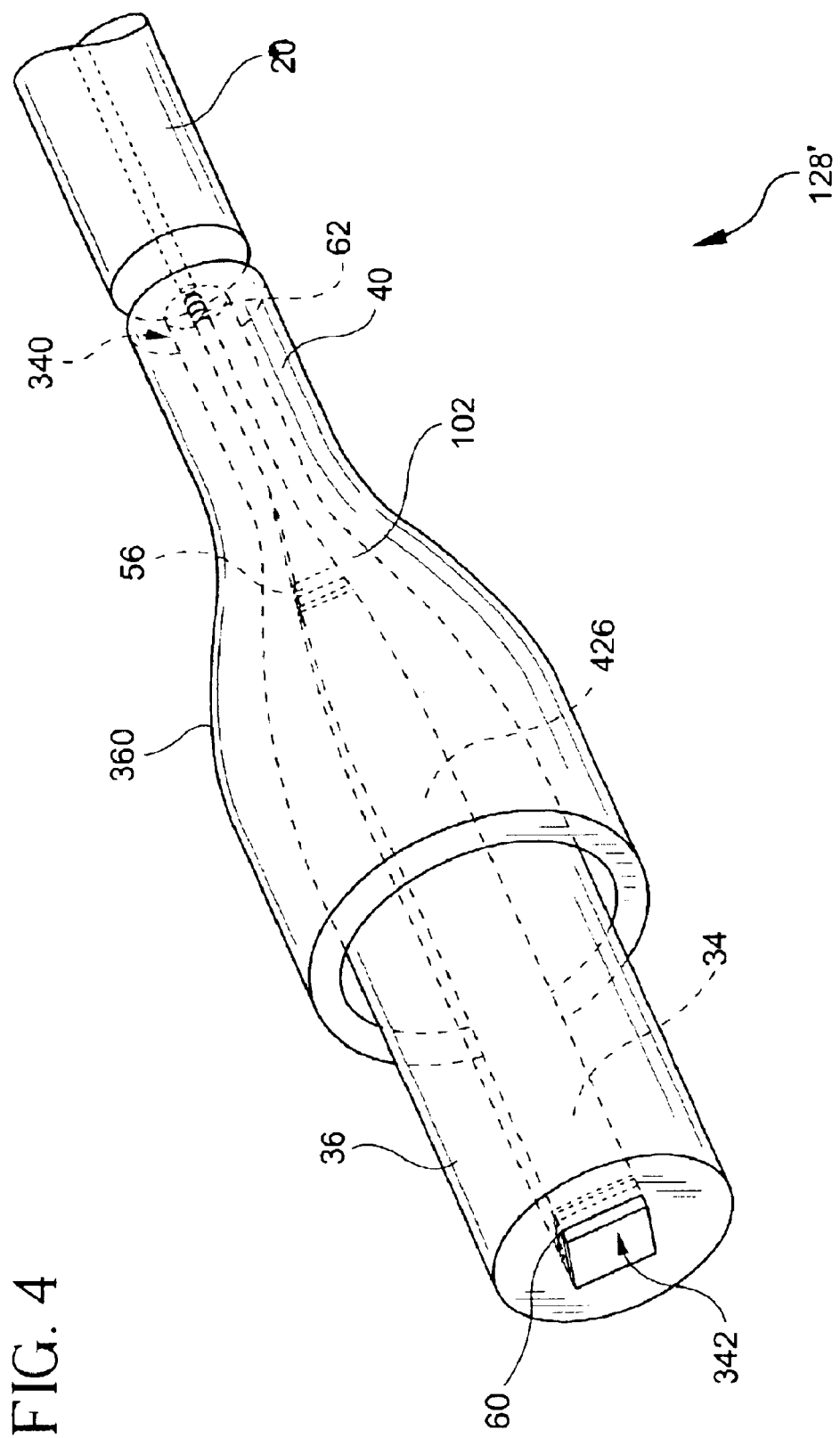
FIG. 4 is a perspective illustration of using a fiber draw process to make a tapered fiber embodiment of the second transformer 128 of FIG. 1, according to the present invention.

Even though planar transformers 118 and 128 are shown, other forms of transformer waveguides are possible, including those tapered in two dimensions and those having a stepped transition between the multimode and single mode sections. The formation of a rectangular waveguide on a planar substrate is additionally advantageous because it allows the integration of a broad-area laser diode 72 having a wide stripe on the same substrate 124. Similar structures can be drawn from a preform for using a fiber waveguide as the second transformer 128, as seen in FIG. 4.

Referring back to FIG. 1, the rectangular cross section of the widest input portion of the input rectangular tapered section 118 forms a passive multimode transformer or mode adapter. The entrance face 242 of this multimode adapter 118 is particularly advantageous because its wide face can be more easily matched to the emission pattern of the wide or broad stripe laser 72, which may have a height-to-width aspect ratio (AR) of about 1:100 to about 3:100. That is, the width of the entrance face 242 can be made substantially greater than its height, which will be defined as a high aspect ratio. Further, the height can be made to correspond to a single mode, thus eliminating the need for vertical tapering. The light emission from the broad stripe laser 72 may be considered as an image being focused on the waveguide face 242. The image of the broad stripe diode laser 72 is substantially wider in the plane of the diode chip than it is in the vertical direction, for example, tens of microns versus a few microns. Thereby, nearly all of the laser diode power can be easily coupled into the waveguide while maintaining a high optical pump power density. The high power density allows a lower power threshold for lasing than that available in circular or square waveguides.

A first multimode reflector, such as a mirror, reflective coating or grating 60 is written or otherwise disposed across the rectangular doped multimode section 126 on an input end of the high-NA multimode waveguide portion 126 for defining an input end of an external optical cavity 46. Similarly, another grating 62, multimode, single mode, or in between, is written across a more multimode end section of the output taper 128 or across the substantially squared single mode section 130 on the low-NA waveguide portion for defining a second end of an external or outer optical cavity 46 that is defined on the other end by the coated, grated, or mirrored multimode input mirror 60. Optionally, the grating 62 can instead be a single mode grating written across a circular core of a single-mode fiber to couple with the single mode section 130. Likewise, another multimode grating 56 is written on either the high-NA waveguide multimode portion 126 or across the core of the mode-selective tapered output portion 128 for maximally reflecting power of the spatial modes at most wavelengths of the pump bandwidth propagated in an inner optical lasing cavity 480 defined on the other end by the highly reflective coated end-facet 80 of the broad area laser diode 72.

It is to be appreciated that even though the input and output rectangular tapered sections 118 and 128 are shown with different shapes where the input tapered section is shown more parabolically or circularly tapered, while the output tapered section is shown more linearly or triangularly tapered, both sections can be of different shapes or be alike (as in the dashed circularly tapered representation of the output taper), as long as the taper is close to adiabatic such that mode changes are not sudden or drastic.

Tapering with planar geometry is easier than with fiber. Additionally, the high refractive index difference, preferably higher than 0.7, between the clad and the core needed for a high NA is difficult to achieve with traditional fiber techniques. Sputtering or pulsed laser deposition (PLD) have demonstrated already the possibility to deposit a slab waveguide of any refractive index. However, although PLD is preferred for depositing the waveguide layer 120 of a core material, such as silicon nitride, silicon oxide, amorphous silicon or any other high index silicon compounds, such as the glass types BLAN LJ having an index of 1.5, C0041 having an index of 1.6, and D0042 having an index of 1.7 available from Corning Incorporated on top of the substrate 124, made from glass, silica, or any other types of glass composition, any deposition technique which can provide the stoichiometry necessary for retaining the high refractive index could be used.

By masking the rest of the planar structure, only the lasing section 126 needs to be doped with the active ion 26, such as Yb. Alternatively, instead of doping only the multimode lasing section 126, for fabrication simplicity, one can dope with the active ion 26, such as Yb, the entire length of the planar structure from the multimode passive planar mode transformer 118 to the single mode taper or single-mode end section 130.

The waveguide layer of a suitable glass composition is then processed by standard photolithography techniques and reactive ion etching to realise the core waveguide 120 with a tapering section at one end of about 100 $\mu$m wide and a few $\mu$m high, about 3 micrometer. At the two ends of the Yb doped multimode waveguide section 126 two reflectors, such as mirrors 60 and 56, with the required transmission and reflection characteristics are used to build the actively doped innermost laser cavity 460. Both of these reflectors can be made by photo inscription of Bragg gratings on the multimode lasing waveguide section 126. Hence, the gratings for the mirrors 60 and 56 of the planar multimode section 126 are inherently also doped with Yb.

The typical dimensions of the input adiabatic mode adaptor or the first transformer 118 has an entry area of about 100 $\mu$m×3 $\mu$m and an output area of about 15 $\mu$m×3 $\mu$m to combine in a total length of the first transformer 118 being somewhere in a range that is less than 1 cm. The typical dimensions of the symmetrical multimode Yb lasing waveguide section 126 is about 15 $\mu$m wide×3 $\mu$m high for a length less than about 2 cm. The output adiabatic mode adaptor or second transformer 128 has an input area about 15 $\mu$m wide×3 $\mu$m high and an output area of about 3 $\mu$m wide×3 $\mu$m high, resulting in a total length of the second transformer 128 being less than about 0.5 cm. Finally, the typical dimension of the symmetrical single mode waveguide section for the laser output is about 3 $\mu$m wide×3 $\mu$m high and can be of any suitable length. By such dimensional planar variations, multimode, single-mode, or in-between modes in the waveguide 120 are created just by widening the dimension for the upper layer or core of the planar waveguide for multimode in contrast to a smaller width for a singlemode waveguide portion.

Hence, in accordance with the teachings of the present invention, an optically-active waveguide laser 30, for use as an optical device, includes a multimode portion 126 for carrying more than one spatial mode at a predetermined wavelength chosen from a bandwidth including a pump wavelength 64 and the lasing wavelength 66. The multimode portion 126 has a first refractive index. A cladding portion, such as the substrate 124, underneath or otherwise proximate the multimode portion 126 has a second refractive index lower than the first index of the multimode portion by preferably at least 0.1 for power enhancement. A multimode grating 60, 56, or 62 is written on at least one section 26 of the multimode portion for reflecting a predetermined wavelength.

For the multimode grating 56, used as a multimode (MM) pump reflector, the predetermined wavelength is any wavelength 64 of the pump bandwidth. The MM pump reflector 56 is designed to reflect the maximum power or as much as can be reflected of the total amount of power at all wavelengths in the pump spectrum (e.g., across the full bandwidth of the pump or multiplexed pumps), and at all or as many as possible modes of all wavelengths in the pump bandwidth. The multimode pump reflector 56 is more power-efficient than a single-mode pump reflector and more efficient than a pump reflector placed outside of the MM section 126, due to the power reflected in the other modes.

For the multimode gratings 60 and 62, as used as a pair of multimode fiber Bragg grating (MM FBG) signal mirrors, the predetermined wavelength to be reflected is the lasing wavelength. The MM FBG signal mirrors 60 and 62 are designed to reflect only the fundamental mode of the desired signal (lasing) wavelength 66. It may reflect higher order modes (HOM) at other wavelengths as well, such as all signals, due to its MM nature. However, as long as these higher order modes do not fall within the gain peak of the fiber laser 30, the HOMs are not detrimental. The signal mirror has high reflectivity when the multimode grating 60 is to be used as the cavity high reflector (about 99%–100% signal reflective and pump transparent) near the input end 342 of the lasing waveguide provided by the multimode section 126 having the inner cavity 460. Alternatively, the signal mirror has low reflectivity (about 4%–10% reflection) if the multimode or singlemode grating 62 is to be used as an output coupler, near the output end of the external cavity 46. The end mirror or output coupler 62 is preferably a low-reflectivity grating offering about 4%–10% reflection that can provide signal feedback and act as an output coupler or low cavity signal mirror. Hence, the input multimode grating 60 is made highly transmissive to the optical pump signal 64 at the pump wavelength $\lambda_P$ and highly reflective at the signal (lasing) wavelength $\lambda_S$ of the output signal 66 while the output grating mirror 62 is made partially reflective (partially transmissive) at the signal wavelength $\lambda_S$ for allowing some of the standing waves in the optical cavity to pass and preferably also at least partially reflective at the pump wavelength. Thus, output coupler 62 and high reflector or input mirror 60 are Bragg gratings that provide reflectivity of light to benefit the lasing operation to form the optical cavity 46. Hence, these end mirrors 60, 62 are reflecting the fundamental signal mode of the signal at the lasing wavelength, and not the pump wavelength.

For telecommunication applications and some non-telecommunication applications, as examples of specific wavelengths desired, the increased need for 980-nm band pump power in erbium-doped fiber amplifiers has led to continuing refinement of a high power laser using the optically-active waveguide laser 30. The optically-active waveguide 30 is preferably doped with Ytterbium (Yb) as one example of an optically excitable active dopant within the lasing waveguide section 126 for operating or lasing at the lasing wavelength 66 of about 980 nm, with an output laser power of about 3 W, when irradiated on the input side or otherwise pumped by the pump wavelength of a pump signal 64 at wavelength $\lambda_P$ at around 915 nm, at a pump power output of at least 1W.

The lasing waveguide or optical device 30 preferably includes at least one Bragg grating. Bragg gratings provide a beneficial means of reflecting light in an optical waveguide format. Although interference filters or dielectric depositions can be used as one or both of the end mirrors 60, 62, Bragg grating reflectors are preferable and can be conventionally written directly onto waveguides by UV patterning or other types of photoinscription. To facilitate UV patterning, the multimode section 126 is doped with a photosensitive dopant, such as germanium (Ge). The multimode gratings 60, 56, and optionally 62 are more reliable and easier to fabricate directly on the waveguide than a dielectric mirror deposited on the ends of the waveguide. Bragg gratings thus provide a preferred solution to the use of micro-optic mirrors on the input end of a high power waveguide laser. A Bragg grating written directly into the core section of the Yb-doped multimode waveguide section 126 can be designed with the required reflection and transmission characteristics. By writing directly into the core, as represented by the multimode gratings 60 and 56 in the multimode section 126 or the optional single mode, instead of multimode, grating 62 of a "tapered" laser embodiment, the reliability risks associated with separate micro-optic mirror approaches can be eliminated.

The lasing waveguide or optical device 30 thus includes a high reflector or multimode input mirror 60 proximate a Yb doped optical waveguide input end 342. High reflector or multimode input mirror 60 is centered about the lasing signal wavelength, such as about 980 nm, and is highly reflective so as to benefit the output of 980 nm light from the lasing waveguide 30.

As another multimode grating, the lasing waveguide 30 includes the output coupler 62 proximate the waveguide output end. Output coupler 62 is centered about the lasing wavelength, such as 980 nm, and is less reflective than the high reflector or input mirror 60 so as to benefit the output of the lasing wavelength, the 980 nm light, from the multimode lasing waveguide section 126.

Pump reflector 56 is also a multimode Bragg grating that provides beneficial reflections. The lasing waveguide or optical device 30 also includes the pump reflector 56 proximate the Yb doped optical waveguide output end of the multimode lasing section 126. The multimode pump reflector 56 is centered about the pumping wavelength, such as about 915 nm, and is highly reflective (about 99% of the first wavelength) so that the 915 m pump light that reaches the end of the Yb doped waveguide is contained in the Yb doped waveguide multimode section 126 so that it can pump Yb ions into the proper excited state.

These Bragg gratings can be made in separate optical waveguide sections, such as dummy or un-actively-doped portions 54, 58, and 61, which are integrated together with an intra-cavity Yb doped optical waveguide section 126, which is a planar waveguide, to form the pumped cavity, inner or intra-cavity 460 of the optical cavity 46 in lasing waveguide or optical device 30 or could be part of the same unitary, integral, and complete single optical lasing waveguide 126 to form the complete rib-waveguide 120 or spliced or otherwise connected variations thereof.

Double-staged, the optically active waveguide 30 incorporates a multimode portion 126 as the gain section of a first stage. The laser cavity 46, defined by multimode grating mirrors or reflectors 60 and 62 (optionally, single-mode grating 62) is within an improved double-stage laser incorporating a mode-selecting filter, mode-adapter, or mode transformer 61, including the output taper 128 and the singlemode portion 130 for the Yb-doped mode transformed or tapered laser (YTL) as the second stage.

For the ytterbium doped laser provided by the active waveguide 30, the signal wavelength $\lambda_S$ equals about 978 nm corresponding to the three-level $Yb^{3+}$ transition. Although the invention is developed in view of $Yb^{3+}$ doping, it is not so limited. The laser or brightness converter 30 may be doped with other transitional or rare earth ions 26, such as $Nd^{3+}$. A combination of $Yb^{3+}$ and $Nd^{3+}$ doping, either by co-doping or by a sequence of differently doped fibers allows pumping at 800 nm rather than 915 or 920 nm.

The first mode adapter or input taper 118 serves as a waveguide with a high numerical aperture (NA) for the input pumping light. The cross-section of the first mode adapter is large enough that it is multimode and may be designed to have a desired shape, e.g., matched to the near field shape of the pump source, such as from the broad-area laser light emitting in a slow axis or any other configuration or shape which increases coupling efficiency of the pump beam. The numerical aperture in the first taper 118 must be large enough to capture the output of the pump laser diode. The actual increase in brightness realized depends on the clad to core ratio (CCR) of the pump cladding area to the core area, with the higher the ratio (CCR), the greater the brightness increase. However, this disparity in area between the core and cladding cross-sections necessitates a long device length, since the absorption of the pump radiation is inversely proportional to this ratio (CCR). Conventionally a high ratio (CCR) of pump cladding area to core area renders achieving a high level of inversion difficult which is important for three-level lasing, because in general the higher the ratio (CCR), the lower the level of inversion that can be achieved with a given pump power. Hence, pump absorption and inversion are related.

Using rare-earth ions which require a high level of inversion, such as Er, Yb or Nd as the dopant in the core of the multimode lasing section 126 to provide gain with high clad to core ratio (CCR) is thus problematic. Even with the very high power available from a diode laser bar, it is very difficult to reach the high level of inversion necessary for the operation of a 3-level system for lasers.

The inversion problem stems from the relationship between the gains in the two competing transitions and the pump absorption for Yb. As a representative example, the gains at the two wavelengths in a Yb-doped germano-alumino-silicate glass (assuming homogeneous broadening) are related by the equation:

$$G_{1030} = 0.25 G_{976} + 0.74 \alpha_P \frac{\Gamma_S}{\Gamma_P} \quad (2)$$

where $G_{1030}$ and $G_{976}$ are the gains at 1030 nm and 976 nm, respectively, $\alpha_p$ is the partially-bleached pump absorption in decibels (dB), and $\Gamma_S$ and $\Gamma_P$ are the respective overlap factors of the signal mode and pump mode with the dopant profile.

Similar relationships with different coefficients will hold for other hosts, such as antimony silicate glass. However, in the specific case of an Yb 3-level transition at 980 nm, Equation (2) can be used to estimate the desired overlap ratio of $\Gamma_S$ and $\Gamma_P$ which is closely related to the area ratio (CCR) of the cladding area over the core area ($A_{clad}/A_{core}$). For Yb, given that an absorption of at least 6 dB of pump is desired, and the inability to suppress more than forty extra dB of gain at the competing quasi-four-level transition at 1030 nm, then using Equation (2), the desired $A_{clad}/A_{core}$ can be calculated.

For example, a lasing waveguide 30, has a doped upper layer or core, represented by the multimode section 126, doped with an optically excitable ion having a three-level transition or any other type of ion requiring a high level of inversion. The core 126 has a core refractive index ($n_{core}$) and a core cross-sectional area. The cross-sectional area can be calculated from the dimensions of the core. The substrate 124 represents the cladding and is underneath the core or upper layer 126. The substrate or cladding 124 thus has a cladding refractive index ($n_{clad}$), less than the core refractive index by about 0.1.

The dimensions of the active waveguide or optical device 30 are designed to allow strong pump absorption, greater than 6 dB, while suppressing long wavelength ASE. The cladding or subtrate cross-sectional area can be calculated from the dimensions of the substrate 124.

Neglecting waveguide loss, $g_{976}$=7 dB. It is desired to absorb at least 6 dB of pump power, but not more than 40 dB of 1040 nm gain can be suppressed by wavelength selective feedback. After substituting these values into Equation (2), the preferred clad-to-core area ratio or overlap ratio of $\Gamma_S/\Gamma_P$ can be found, and a maximum ratio of 7.6 is found for the rare-earth dopant Yb for use in an Yb waveguide laser at 980 nm.

For all rare-earth dopants as the optically excitable ions, such as Er, Nd, Tm, and Yb to provide the active medium, especially those requiring a high level of inversion, a maximum allowable cladding area exists for the waveguide structure.

In general, it is not the clad-to-core ratio (CCR), but the absolute size of the multimode core in a waveguide laser that is most critical for efficient laser operation.

Accordingly, the core or upper layer on a planar structure can be made any size that fits on the bottom cladding or substrate 124. However, it is preferable that the core of the first multimode transformer 118 has a face 242 that is similar in size and NA to the emitting area of the broad area laser diode 72. Similarly, it is preferable that the core of the second transformer 128 has a face in the singlemode portion 130 that is similar in size and NA to standard single-mode fibers for efficient light coupling in telecommunication and some non-telecommunication applications. With the typical single-mode core radius of 3 to 4 um, a clad-to-core area ratio CCR (Aclad/Acore) of 10:1 to 20:1 is possible. Using a typical core radius of a=3 $\mu$m, the clad-to-core area ratio CCR is $A_{clad}/A_{core}$=500/($\pi \cdot 3^2$)≈18, which is well below values recommended in prior references or ever reported for working double-clad lasers.

Preferably, the cross-sectional area of the core should not exceed 500 $\mu m^2$. If the available power is doubled in the laser diode as in a 4 W pump diode, recommended values are then also doubled such that the clad-to-core area ratio range is now 20:1 to 40:1 and the core area is now less than 1000 $\mu m^2$.

What is important for 3-level devices, such as these rare-earth-doped planar waveguide lasers, is the level of pump power density that can be created in the core, which defines the achievable inversion. To find the maximum desired area of the core, it is more convenient to use the power threshold estimate equation for a laser. For any 3-level device the threshold pump power $P_{th}$ in a laser always has to be higher than the saturation power $P_{sat}$. In other words the laser must be "bleached" (i.e., where approximately one-half lasing atoms have been excited into an excited state) along a substantial part of its length. $P_{sat}$ is the saturation power defined as $$P_{sat} = \frac{hv}{\sigma_{ap}\tau} A_{core} \qquad (3)$$

Hence, the smaller the core area ($A_{core}$) the lower is the saturation power $P_{sat}$ because these two terms are directly related by Equation (3). The smaller the saturation power is, the greater the inversion because these terms are inversely related, hence the higher inversion can be achieved to make a 3-level laser work.

The threshold power $P_t$ scales in proportion to the core area ($A_{core}$) and the length of the laser. The threshold pump power is well approximated by the following equation where it can be seen that the threshold pump power is higher than the saturation power by a factor $\alpha_p/4.343$ when the laser is bleached:

$$P_{th} = P_{sat}(\alpha_P/4.343) = \frac{hvA_{core}}{\sigma_{ap}\tau}(\alpha_P/4.343) \qquad (4)$$

where $\sigma_a$ is the pump absorption cross section, $\tau$ is the fluorescent or metastable level lifetime, $A_{core}$ is the cross-sectional area of the core, and $\alpha_p$ is the pump absorption in dB. Hence, from Equation (4), the power threshold for lasing depends essentially on the dimensions of the core and the background loss in the active waveguide over the pump absorption length.

For example, if the Yb active waveguide 30 is pumped with a single 2 W broad-area laser diode 72 and the input pump power $P_{in}$=1600 mW is actually launched in the core or upper layer of the entrance face 242 of the first transformer 118, for efficient laser operation the threshold power required for lasing should not exceed about a quarter of the input pump power, or 400 mW. Taking $\alpha_p$=6 dB, hv=2.16× $10^{-19}$ J (for a 920 nm pump which is about the same for a 915 nm pump), $\sigma_{ap}$=8.3×$10^{-21}$ m², $\tau$=0.8 ms and $P_{th}$=0.4W, the core area is preferably $A_{core}$=890 $\mu$m² from Equation (4). Hence, for a Yb doped 976 nm laser pumped with a 920 nm broad-area laser diode, the recommended values for clad-to-core area ratio are 2:1 to 8:1 from Equation (2) and the cross-sectional area of the core should not exceed 900 m² from Equation (4) because the threshold should be decreased as much as possible.

However, the practical size of the minimum area of the core will be limited by the choice of materials ($NA_{core}$ and the index contrast or index delta) and the quality of pump focusing optics. With a core aspect ratio of 2 or higher it would be impossible to have a cladding to core area ratio CCR of less than 2, unless the core is rectangular too. Furthermore, with conventional optics it is very difficult to focus a 100 um broad area laser into a spot smaller than 20 um in size, and it is not practical to make a single-mode core larger than 10 um because the required index contrast or index delta will be too low. This, again, dictates that the minimum CCR is about two.

In a waveguide laser with a small clad-to-core area ratio (CCR), cladding modes of the signal will overlap with the doped core to a sufficient degree to experience gain in the higher-order modes (HOM). Any mode of the waveguide has a certain profile of the optical field. It is only amplified as much as that field overlaps with the doped region. Most of the field of the fundamental core mode is within the core of the multimode lasing section 16, and that mode would obviously be amplified, if the required level of inversion were achieved. However, the core supports many different modes because of its larger size. Some ions will always transition spontaneously, giving equal amount of photons to every mode, core and cladding. If the cladding is comparable in size to the core, at least some of the higher-order core signal modes will have a sufficient overlap of their field with ions in the core to also be amplified. This will degrade the laser efficiency, because optical energy accumulated in the higher-order cladding modes (ASE) will not be coupled to a single-mode output for a telecommunication application.

One solution for the laser, is to use mode-selective feedback to ensure a fundamental mode-only laser operation. If sufficient length is provided, the waveguide itself can be used as the laser with the output coupler 62 written on the core or upper layer of the second transformer 128 near its single-mode output end, as is shown. However, if more length is needed or better mode-matching with a single-mode fiber is desired, the output coupler 62 can be instead written, farther down, on the single-mode core of a single-mode fiber or waveguide 130. A mode-matched coupling will now be in the form of a splice, a downstream pigtail or a taper to couple with a single-mode fiber or planar waveguide containing the output coupler grating as the output end of the extended optical cavity. This grated single-mode fiber or waveguide 130 thus provides an intra-cavity transverse-mode-selective element that is coupled to the output end of the optically active waveguide for selecting the lowest transverse lasing mode. Hence, to provide mode-selective feedback, the output single-mode fiber or waveguide 130 is mode-matched to the core mode of the lasing section 126 by the second transformer 128 and the signal reflector, output coupler, or the signal mirror 62, in the form of a single mode Bragg grating is provided in the single mode output fiber or waveguide 130, to ensure stronger optical feedback for only the core mode. If the internal loss is sufficiently small within the single-mode portion 130, then the laser efficiency is relatively insensitive to the external reflection in the single mode portion 130 outside of the mirror 62. Therefore, a 4–15% external reflector 62, on the single-mode portion 130 instead of somewhere near the end of the second transformer 128, will not significantly decrease efficiency.

Alternatively, the reflector or output mirror 62 can be placed in a single-mode output fiber itself, without the intervening single mode fiber or waveguide section 130. Even its 4% reflectance of the single mode grating 62 across an air gap to a butt coupled output fiber is sufficient to define the optical cavity. The single mode fiber with the grated mirror would then be butt coupled to the output end of the core of the second transformer 128, with or without the intervening single-mode section 130 and replacing the grating 62 within the section 130.

Once the fibers are mode-matched, only one mode, the fundamental mode of the lasing signal 66 in the core mode of the waveguide laser 30, will receive feedback, and the cladding modes will not. Hence, the reflector or mirror 62 reflects the signal light to perform a mode selection function. The presence of the reflector 62 and mode matching will ensure that cladding modes never lase.

Preferably, the mode field diameters (MFD) for the respective lowest-order modes are thus matched across the junction between the output end of the active waveguide 30 and the single-mode fiber (not shown) for a telecommunication application, for example. If not index-graded, the core near the end of the second transformer 128 is sized sufficiently small such that the core supports only one transverse mode at the output signal wavelength such that this single transverse mode has a mode field diameter equal to that of a standard single mode fiber for optimum coupling.

As an example, an optional single mode section 130 can be inserted to provide an output mode closely matched to a CS980 single-mode fiber 20. Even though other single-mode fibers are usable, the CS980 single-mode fiber made by Corning, Inc. for propagating wavelengths at 980 nm and having a standard 125 micron outer diameter is preferred for telecommunication applications.

Minimizing the mismatch of the coefficient of the temperature expansion (CTE) is very important for increasing waveguide reliability and to facilitate the fabrication process of the planar structure. A less than $+/-30\times10^{-7}/°$ C. over the range 0–200° C. CTE mismatch is preferred between the core 120 and substrate 124. Hence, the core is preferably also made from a glass having a coefficient of thermal expansion (CTE) mismatch with the material of the substrate of less than $+/-30\times10^{-7}/°$ C. over the range 0–200° C. These requirements are relatively easily met using silicon dioxide ($SiO_2$) with a CTE of about $5\times10^{-7}/°$ C. For some fiber-making techniques to make the second transformer 128, as an alternative fabrication method, such as triple-crucible draw, it is also important to match the viscosities of the core, inner and outer cladding glasses for better control over a waveguide shape.

Since the present invention teaches that a high inversion level should be maintained throughout the whole length of a 3-level laser, a significant amount of pump power would pass through and escape on the other end. Therefore, for maximizing the laser efficiency, it would be preferable to use the pump reflector 56 to reflect the residual power back into the device.

Even a very small amount of signal reflection can cause undesirable multi-path interference effects. Hence, the pump reflector 56 would preferentially be written in the host cavity waveguide, inside the doped lasing waveguide section 126 near the output end, but could also be placed outside the lasing waveguide section 126 and/or be written in a different fiber which is spliced or otherwise coupled to the lasing waveguide. Thus, the multimode grating 56, optionally displaced by a small distance from the end of the multimode lasing section 126 within the non-doped second transformer section 128, acting as a pump reflector, could also provide some mode-selective feedback for the signal, if it is designed to reflect 100% at the pump wavelength and 5–15% at the signal wavelength, or for other reflection spectra, such that it is transparent for the signal and highly reflective for the pump.

Mode-matched coupling (splicing or otherwise connecting) the Bragg grating in the non-actively doped multimode portion 58 of the second tapered transformer 128, acting as the pump reflector 56, to the single mode fiber (not shown) directly, or to an intervening single mode section 130, can provide mode-selective feedback by maximally reflecting power at most of the spatial modes of the wavelengths of the pump bandwidth propagated in the multimode portion of the second tapered transformer 128 for enhancing the power output of the laser.

In general, a multimode Bragg grating (MM-BG) used thus as a pump reflector 56, re-uses the residual pump power which is not absorbed at the end of the multimode Yb-doped region. For the pump reflector 56, as many modes as possible should be reflected at the pump wavelength, e.g., in the 915 or 920-nm band. The pump reflector should reflect as many modes as possible in the high NA multimode lasing section 126 but should not reflect the laser wavelength at 980 nm. These pump modes may either be self-reflected, or may be coupled into other backward propagating modes; either reflection will aid in re-using the pump. Typically all higher order modes reflect at shorter wavelengths, since $n_{eff}$ is lower for each higher order mode.

Figure 2:
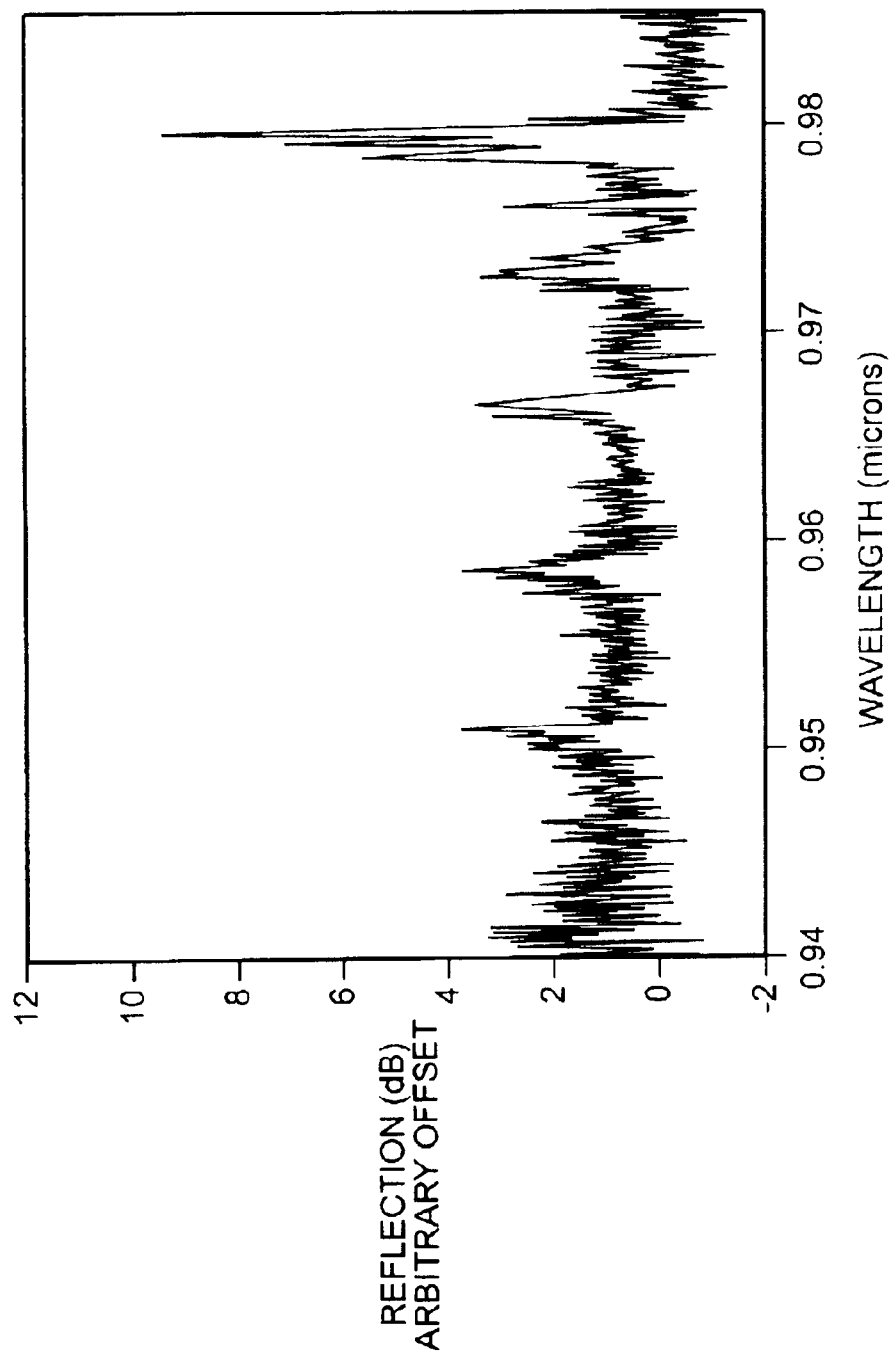
FIG. 2 is a graph of the reflection spectrum of a multimode input mirror grating 60 of FIG. 1, according to the present invention.

Referring to FIG. 2, the reflection spectrum of a uniform Bragg multimode grating shows that the Bragg condition is met for higher order modes at successively shorter wavelengths. To reflect the higher order modes, it is thus desirable to increase the grating period, using a chirped Bragg Grating (BG). Chirp refers to a variation in frequency or periodicity along the grating.

As an example of the pump wavelength bandwidth 64, a target pump window from 915 nm to 925 nm is assumed to allow for pump wavelength shifts with increased diode drive current of the broad area laser diode. Reflection of the fundamental mode at 925 nm requires a grating period of $\Gamma_{min}$=302 nm in a waveguide with $n_{core}$=1.53. Reflection of the highest order mode at 915 nm ($n_{eff}$~1.456) requires a grating period $\Gamma_{max}$=314 nm. A MM BG with 12 nm of chirp would therefore effectively reflect all pump modes. The lasing mode at 978 nm is not affected by the pump reflector 56 because the grating period is less than 320 nm which is the grating period for reflecting the lasing wavelength.

Figure 3:
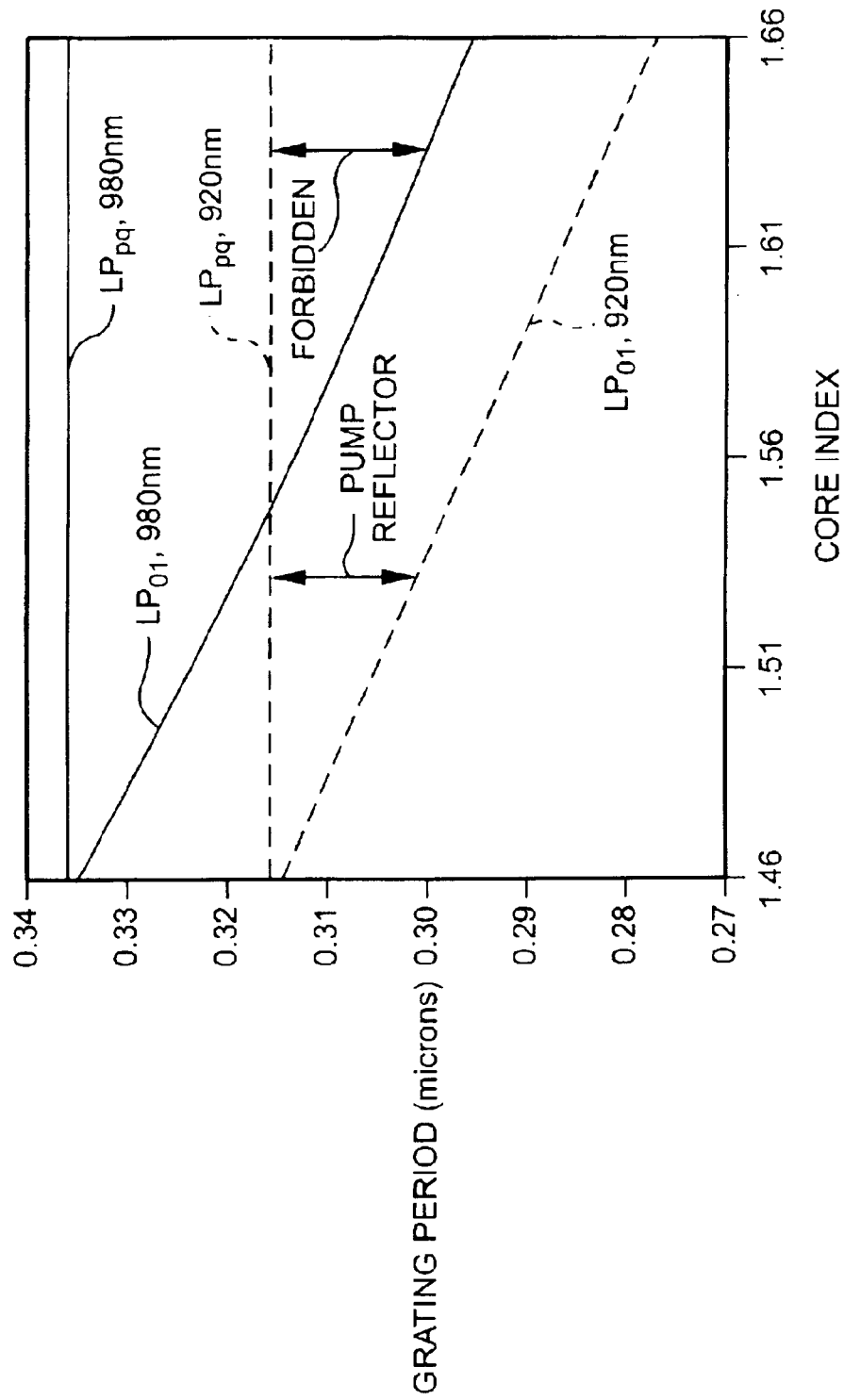
FIG. 3 is a graph of the grating period parameter space for a chirped multimode pump reflector 56 of FIG. 1, according to the present invention.

Referring to FIG. 3, the allowed parameter space for a chirped BG design as a function of core index is shown. The dashed lines represent the lowest order and highest order modes for a pump at 920 nm. The solid lines indicate these modes for the desired 980 nm laser line. The ideal pump reflector spans the range of BG periods between the dashed lines, but does not exceed the $LP_{01}$ 980 nm boundary. There is a limitation about not reflecting signal modes due to the small wavelength separation between the pump (915–925 nm) and signal bands (976–980 nm). Gratings in high index waveguides run into design limitations associated with a high core index. There is a limit to the allowed chirp on a pump reflector if the index is too high, because it is desirable to avoid reflecting the fundamental mode at wavelengths near the desired lasing signal.

For pump and signal wavelengths at 920 nm and 980 nm, respectively, and assuming a silica substrate, this limitation is at around n=1.55 as shown in FIG. 3. Reflection of the 980-nm fundamental mode thus becomes an issue when the core index exceeds 1.55. This core index limitation will change depending on waveguide geometry, substrate material, and the exact wavelengths in question.

In practice, the maximum grating period can be shorter than that indicated by the highest order mode at 920 nm (upper dashed line, FIG. 3). Since most of the pump power is carried in the lower order modes, reflection of the first 30 to 50 modes is expected to be sufficient for pump reflection; the upper bound on the grating period $\Lambda$ is then determined by the effective index $n_{eff}$ of the $30^{th}$ or $50^{th}$ mode, rather than by the core index $n_{core}$.

Reducing the grating period provides some design room for both high NA waveguides and for lasing waveguides with low photosensitivity. Low photosensitivity implies low chirp rates and/or long interaction lengths to achieve high reflection coefficients. The exact chirp rate and grating length would be determined by the photosensitivity of the chosen multi-component silica waveguide and the allowed extent of the grating inside the laser cavity.

The index (n) of the waveguide is fixed by the waveguide and cavity design, e.g., by variables such as what the required NA is. FIG. 3 shows how to choose the grating period, or the acceptable range of chirp, in a waveguide with $n_{core}$=1.456, and $n_{core}$=a value on the x-axis.

The grating bandwidth of the pump reflector should be as large as the pump bandwidth in as many modes as possible of the pump. The effect of this is that the grating bandwidth is larger than the pump bandwidth, when looking at all the modes reflected. For example, if the fundamental mode at 915 nm is reflected, then higher order modes are automatically reflected at shorter wavelengths, e.g. 910 nm. Likewise, to reflect the highest order modes at 925 nm, lower order modes at longer wavelengths would be reflected, e.g. 930 nm.

Hence, to choose the grating period or chirp of a pump reflector, the present invention teaches that the multimode pump reflector should have a grating period between a minimum grating period associated with the fundamental mode of the pump wavelength and a maximum grating period that is the lesser grating period associated with one of the fundamental modes of the signal wavelength or of the highest mode of the pump wavelength. Referring to FIG. 8 for this rule implementation, select the waveguide core index on the x-axis and find the y-value corresponding to the line $LP_{01}$, 920 nm. This gives the lower limit on the grating period. Using that same x-value, find the y-value which corresponds to the lesser of $LP_{01}$, 980 nm (if $n_{core}$>1.55), or $LP_{pq}$, 920 nm ($n_{core}$<1.55). This gives the upper limit for the grating period. This corresponds to selecting the pump reflector in the region shown by the double-ended arrow labeled "pump reflector", and keeping it out of the region labeled "forbidden region". If the well-known phase mask writing technique is used, the phase mask period is found by doubling the grating period.

The input mirror 60 in the multimode lasing section 126 can also be designed for optimum mode discrimination. Both the fundamental and some lower order modes with very similar effective indices can experience significant gain, as discussed in relationship with the output mirror 62.

The tapered waveguide laser 30 preferably has a chirped (or very slowly chirped) MM input mirror grating 60 with the fundamental mode matched to the desired narrow band lasing signal wavelength. To avoid unwanted reflections at other wavelengths with potential gain, the bandwidth is limited by the design rule of effective indices associated with a high core index. For example, if the grating has a period of 0.3015 μm, the Bragg wavelength for modes 0, 1, 2 of for a signal wavelength of 980 nm are 977.5 nm, 976.7 nm and 975.6 nm. Hence, if the grating bandwidth is ignored, higher order modes will be reflected and probably lase along with the fundamental, with Bragg wavelengths falling within the laser bandwidth (of about 2 nm). Restricting the grating bandwidth to less than 0.5 nm, however, would selectively reflect only the fundamental and favorably increase differential modal loss.

To choose the grating period or bandwidth of a signal reflector or mirror, select the waveguide core index on the x-axis and find the y-value which corresponds to $LP_{01}$, 980 nm. The target here is a multimode signal reflector, so it is preferably chirped. The grating bandwidth is determined approximately by the following equation:

$$\Delta\lambda/\lambda_j < \Delta n_j/n_j. \quad (Eq. 5)$$

In this simplified condition for maximizing differential modal loss, the left-hand term is the grating bandwidth divided by the Bragg wavelength of the $j^{th}$ mode, and the right-hand term is the effective refractive index difference between the $0^{th}$-order mode and the $j^{th}$ order mode divided by the latter-mode effective refractive index.

For example, from equation 5, if the effective index $n_{eff,0}$=1.62105, then to design a 980 nm reflector, $\Lambda$=0.980/(2*1.62105)=0.3023 μm. The next mode occurs at $n_{eff,1}$=1.61978, or at 979.23 nm, so the grating bandwidth should be less than 980.0−979.23=0.77 nm. This could be made with a uniformly periodic BG anywhere from about 340 μm (0.77 nm bandwidth) to 520 μm (0.5 nm bandwidth) long, or with other well-known designs such as a Gaussian apodized grating.

Gratings in high index waveguides also require special phase masks, typically with much lower periodicity than standard phase masks, because the Bragg condition has to be satisfied to accommodate the effective index being a lot higher. These lower periodicity masks are commercially available, but at higher cost because they require customization.

Several methods may be used to achieve chirped multimode BGs. The simplest is to use a specially designed chirped phase mask. The FBG exposure process is then identical to that of a uniform BG. Beam manipulation approaches using a diverging (or converging) beam and a uniform phase mask may also be used, but do not provide as wide of a chirp range. As the beam spreads (converges) behind the phase mask, the grating period shifts slightly and a chirped BG may be written, either by writing regions of the BG sequentially, translating the waveguide to a new section and to a different distance from the phase mask with each exposure, or by tilting the waveguide with respect to the plane of the phase mask.

The optimized grating depends on the other design parameters of the waveguide laser and vice versa. In general, maximizing the overlap between pumping light and actively-doped waveguide core is advantageous. Thus it is desirable to make the core larger and the substrate smaller. A larger core improves pump absorption and a smaller substrate helps create higher inversion with less pump power. However, other factors already discussed and to be seen, limit the optimum core size to the one corresponding to a nearly two-moded core. The example easiest to follow is one using the Yb waveguide laser at 980 nm. Due to physics, an area ratio (CCR) of not more than 5 or 6 is needed. Given the current material choice and capabilities of coupling optics, there is a limit to which the substrate size can be decreased before the pump coupling efficiency will start to suffer. Given that minimum substrate size, the only way to decrease the clad to core area ratio (CCR) below 5 or 6 is to start making the core larger and larger.

However, the index difference or delta between the core and the substrate cannot be made too small, or the optical field will simply not be confined in the core, as already discussed, and the core waveguide will have too much bend loss. Hence, with a given index difference or delta, one can only increase the core dimension so much before the core becomes multimoded (up to about 10 um, in practice), unless the core is made with a graded index. It is known that for a given delta, a slightly larger core can still be single moded if the core has a graded index. In the case of a Yb laser waveguide operating at about 978 nm, the larger size graded index core lowers the gain for the unwanted 1040 nm line. In other cases, especially if the substrate has a noticeable amount of passive loss, a larger size graded index core allows it to absorb the same amount of pump power in a shorter waveguide length, increasing the device efficiency. Grading of the core index profile can be achieved, for example, by allowing for significant dopant diffusion.

An ultimate version of the graded index is a core that grades down in index all the way to the edge of the substrate. Then, there is no defined border between the core and the substrate, they become one. And still the 0-order or fundamental mode of such a waveguide is confined in its very center with a relatively small mode field diameter (MFD), and the higher order modes fill the total waveguide area more uniformly. Hence, an analog of the area ratio (CCR) is a modal area ratio that is specified rather than the glass layers area ratio.

As discussed, many factors affect the optimum design of a waveguiding structure. The number of modes and their intensity (field) distribution within the waveguide depend on the waveguide shape, index contrast or index delta $\Delta$, and size.

For the case when a line between the core and the inner cladding (graded index) is hard to draw, the physical cross-sectional area ratio (CCR) is not simply defined. In this unique case of a high-delta graded waveguide used as both the core and the substrate, the modal area is defined as the physical area where the optical intensity of the mode is higher than $1/e^2$ of its maximum (or electric field amplitude is higher than $1/e$ of its maximum). In other words, when the core and the substrate form a single waveguide made of a material with a continuously varying composition such that the refractive index is progressively decreased (graded) from a central part to an edge of the waveguide, the central part of the waveguide is doped with the optically active ion having the three-level transition to form a doped area, then the overlap between the fundamental (zero-order) signal mode of the waveguide with the doped area is preferably designed to not be more than seven times larger than the overlap of all pump modes of the waveguide combined with the doped area.

The direct analog for the physical cross-sectional area ratio (CCR) would then be the ratio of a/b where "a" is the cross-sectional area of all propagating pump modes combined and "b" is the cross-sectional area of the fundamental (zero-order) signal mode. All modes in this case are modes of the graded waveguide which comprise both the core and the inner cladding. However, the pump will use all of these modes and the signal ideally will propagate only in the zero-order one, giving the desired ratio of about 3:1 to 5:1 for a reasonably high delta. This 3:1 to 5:1 modal ratio of the cross-sectional area of all propagating pump modes combined over the cross-sectional area of the single signal mode is especially beneficial for the Yb 3-level laser.

A similar definition can be given for the standard case, when the core and the substrate have a clear border, because once again, the pump uses many modes of the substrate and the signal only uses one mode of the core. However, for the standard case this definition would give almost exactly the same numerical value as the physical cross-sectional ratio (CCR).

Optically, for conserving "etendue", the product of the $NA_{core}$ and spot size of the waveguide laser 30 has to be equal or greater than the product of the numerical aperture ($NA_{laser}$) and the spot size on the laser diode 72. Instead of bulk optics, the first multimode transformer 118 is used to de-magnify the image of the laser emitting area from the diode 72. The same first multimode transformer 118 will automatically make a beam more divergent, or increase its NA. The core (serving as a pump waveguide) NA, $NA_{core}$ must then be equal or higher than that of the incoming beam, to collect all of the light. The general definition for the NA refers to the maximum divergence angle at which a light beam can enter a waveguide and still experience total internal reflection needed for waveguiding. For a typical 100 $\mu$m broad stripe laser, the divergence angle parallel to the stripe (slow axis) corresponds to an NA of approximately 0.1.

These NA values represent a very high refractive index contrast, or delta between the core and substrate. However, they can be achieved with a planar design. However, the chemical and physical properties of the core must be compatible with the substrate, and spectroscopic properties of the dopant must be preserved. It is known that $Yb^{3+}$ and $Nd^{3+}$ can be doped into glasses other than silica and produce nearly the same transition levels.

The NA of the waveguide laser also relates to the minimum core size and to the threshold power value for a particular aspect ratio. In general, the higher the waveguide NA, the lower the threshold power required. Relatively, the threshold power required for a square core, such as for the single-mode section 130, having a value of unity for the aspect ratio (AR) of the height to the width is the highest. Hence, the dimensions of the first transformer 118 are designed to be consistent with image sizes of broad stripe diode lasers. This reduction in threshold power for lasing is greatly advantageous if a 2W diode is the limit of commonly available broad stripe pump sources.

For efficient coupling of the pump light, the upper layer or core geometry of the planar waveguide should match the geometry of the pumping diode. Unfortunately, the light emitting spot of a broad-area semiconductor laser is strongly asymmetric, with an aspect ratio of at least 100:1. The beam is typically single-moded (Gaussian) in the fast axis direction (perpendicular to the wafer plane) and strongly multi-moded in the slow axis direction (parallel to the wafer plane). The slow axis direction is the most critical one, ultimately defining the allowable size of the pump waveguide.

Hence, referring back to FIG. 1, the first transformer 118 can be designed with a variety of elongated shapes that can be used for taper. The longer (slow axis) dimension should be at least 10–20% larger than the width of the diode laser aperture ($D_{laser}$ 48) times the ratio of the diode slow axis $NA_{laser}$ to the waveguide NA. For example, if a 100 $\mu$m diode laser with 0.1 NA is used for pumping and the waveguide NA is 0.6, then the longer dimension of that cladding should be at least $1.2(100/6)=20$ $\mu$m. To keep the cross-sectional area of the core as small as possible, the shorter (fast axis) core dimension, such as the height of the waveguide 120 should be made just large enough to accommodate the single mode core. In this exemplary case, the height is 3 $\mu$m. Oblong or an otherwise elongated shape of the core combined with the relatively small substrate-to-core area ratio (CCR), will ensure uniform pump absorption by equalizing pump modes overlap with the doped core.

No attempt has been made to accurately illustrate their relative dimensions in the cross-sectional area representations of the active waveguide 30. Also, it is possible to use air (n=1) as the cladding on top of the upper layer or core 120.

The length 46 of the optical cavity of the active waveguide 30 is relatively unimportant beyond its being very long compared to the wavelengths involved so that any higher-order modes are adequately attenuated over its length. In practice, this length 46 is determined by the level of rare earth doping in the core and desired pump absorption efficiency. In some circumstances 1 cm in length is more than adequate. Including the first and second transformers 118 and 128, the total length of the active waveguide 30 is in a range about 2–4 cm.

Instead of using a separate focusing element, the optical characteristics of the broad stripe laser 72 may be good enough to allow direct coupling into the multimode face 342 of the lasing section 126 without the use of the first transformer 118. However, if the first transformer 118 having the face 242 is needed, the tapering of the first transformer 118 enables efficient coupling of pump power from broad-area laser diodes having typical emitting apertures with dimensions of 100×3 $\mu m^2$ and NA's of 0.1/0.55 in the slow and fast axes, respectively, into the first transformer 118 with a rectangular core cross section of 100×3 $\mu m^2$ and effective numerical aperture of >0.6. The terms "slow" and "fast" refer to the planes that are "parallel" and "perpendicular," respectively, to the laser diode junction plane. In order to efficiently couple light from the broad-area semiconductor laser 72 with emitter dimensions of 100×3 $\mu m^2$ and NA's of 0.1/0.55 in the slow and fast axes (measured at 5% of the maximum far-field intensity points), respectively, coupling optics or other beam shapers, mode adapter, such as the first transformer 118 can be designed to produce an image of the emitter near field with dimensions of about 100×3 $\mu m^2$ tapering from the input core cross section 242 to an output core cross section of about 15×3 $\mu m^2$ in the slow and fast axes, respectively. Hence, the first transformer functions as an anamorphic coupling element that reduces the input pump linear divergence in the "fast axis."

Regardless of direct coupling or not, the pump signal may be provided by the laser diode 72, in the form of AlGaAs or InGaAs broad stripes, arrays, or a diode bar emitting at a wavelength shorter than 976 nm but within the ytterbium absorption band. The practical pump bandwidth extends from 850 to 970 nm with a more preferred range being 910–930 nm and a most preferred range being 915–920 nm. The precise values of these bands and the lasing wavelength may shift by a few nanometers depending upon the dielectric host and the particular application needed.

The similar rectangular, oblong, or otherwise elongated aspect ratios of the diode or broad-area laser 72 and of the input multimode section 126 (both vertically or horizontally aligned alike) allows the optical exciter, beam shaper, mode adapter, or multimode transformer 118 to focus the relatively large-size output of a wide stripe or "broad area" laser diode 72 or even a diode bar into the wide multimode face 242 of the transformer 118 before tapering to the smaller face 342 of the multimode section 126 of the brightness converter 30. Preferably, the transformer 118 has an aspect ratio greater than 3 and sized sufficiently small to allow the coupling of pump light from the broad-area laser diode 72 to create sufficient high pump power density.

The rectangular, oblong, or other elongated cross section of the first transformer 118 are particularly advantageous because its entrance face 242 can be more easily matched to the emission pattern of the wide stripe laser 72, which may have a width-to-height aspect ratio (AR) of 100:3. That is, the width of the waveguide entrance face 242 can be made substantially greater than its height, which is defined as a high aspect ratio. In accordance with the teachings of the present invention, since the waveguide cross-section 242 of the first transformer expands from the lasing section 126 to match the shape of the diode 72, then nearly all of the laser diode power can be easily coupled into the waveguide while maintaining a high optical pump power density. The high power density allows a lower power threshold for lasing than that available in circular or square waveguides.

However, it is desirable for the output of the waveguide laser or brightness converter 30 to have a substantially circular single-mode transverse field as its output from the second transformer 128 or in the single mode section 130 for telecommunications applications. It is desirable for the output of the waveguide laser 30 to have a substantially circular mode field because a conventional fiber for telecommunications also has a circular mode field and the better the mode field size and shape match, the lower the coupling loss.

For any given NA of the first transformer 118, the longer dimension of the first transformer 118 and the multimode lasing section 126 will be fixed by the requirements to couple all of the available pump power (since the size of a broad-area laser emitter is fixed and can be demagnified only by the amount defined by the first transformer NA relative to the broad-area laser NA). The second or shorter dimension, in width, can then be varied and is varied by the tapering of the first transformer 118. However, if the longer dimension is the same, an elongated shape with an aspect ratio of 3:1 will have a surface area 3 times less than the one with a 1:1 aspect ratio. Therefore, a corresponding laser with such a smaller surface area can have roughly a three times lowered threshold. Thus, while it is possible to build a 3 level laser with a circular waveguide, as with fibers, a planar waveguide with a rectangular or otherwise elongated shape will provide a significantly lower threshold and therefore higher efficiency.

A lot of factors in designing an optimum 3-level waveguide laser relate back to the traditional cladding to core area ratio (CCR) for fibers. With a given waveguide NA and pump laser NA, one of the dimensions of the core of the waveguide can not be decreased below a certain size. But to decrease the surface area as much as possible for higher inversion, in accordance with the teachings of the present invention, the other dimension can be squeezed. Thus, it is preferred that neither the area nor an aspect ratio specification by itself is sufficient for building an efficient device and only complying with both specifications at the same time can provide sufficient inversion and low threshold. Planar fabrication of waveguides allow more flexibility in planar geometry then the fiber drawing process for fiber geometry.

For further modal gain discrimination, other than using the selectivity of the input and output grating mirrors 60 and 62, the shape and dimensions of the first transformer 118 are chosen from considerations involving maximization of pump power coupling efficiency.

A larger core in the multimode lasing section 126 increases the gain of higher-order modes (HOM) of the waveguide structure, which can readily lase, hindering diffraction-limited performance. Preferably, the core cross-sectional area is dimensioned such that the higher-order modes of the inner cladding experience a lower overlap with the doped area than the fundamental mode. As the core size increases, the $\Gamma$ factor of HOM's increases, approaching the value for the fundamental mode, leading to reduced differential modal gain discrimination. According to the teachings of the present invention, the core is designed to become large enough to be multimoded and a tapered, stepped or otherwise mode-transformed planar laser waveguide 30 thus results from mode transforming the input and output of such a multimoded core of the lasing section 126.

Functionally, a "stepped-up" embodiment of the multimode "tapered" waveguide laser or a mode-transformed laser results when the multimode section 126 is disposed next to the singlemode section 120 with intervening first and second transformers 118 and 128 disposed before and after the multimode lasing section 126. In the multimode section 126, the multimode core has the same height of the singlemode section 130 but the multimode core section 126 has a larger numerical aperture (NA) than the single mode portion 130. However, the multimode portion of second transformer 128 is larger (or "stepped-up") than the singlemode portion of the second transformer 128. The multimode lasing portion 126 is assisted by a larger numerical aperture (NA) multimode first transformer portion 118 at the input than at the output of the multimode lasing portion 126 for use with a smaller numerical aperture (NA) single mode portion 130 that is assisted by the second transformer 128.

Embodied as a stepped waveguide laser, the planar brightness converter structure 30 has a uniform larger multimode section 126 and a uniform smaller single-mode fiber section 130. As previously described with the inclusion of the gratings, reflectors, or other types of mirrors 60, 56, and 62, the multimode section 126 receives the pump light 64 and provides most of the optical lasing action. The first and second transformers 118 and 128 adiabatically or otherwise smooth out the step mode changes.

The single-mode section 130 is butt coupled or otherwise joined to the second transformer 128 having the multimode to singlemode or near singlemode sections and effectively outputs a lasing signal 66 having only the fundamental mode. The mode field diameters of the lowest-order modes are matched in the two dissimilar sections 126, 130, by the intervening second transformer 128 having the same widths as the dissimilar sections at the input and output of the second transformer. As a result of using the same core and substrate material for planar waveguides where the planar geometry of the core is easily changed, the larger multimode section 126 has a larger contrast between its core 120 and substrate 124 and is thus a high-NA waveguide while the smaller single-mode section 130 has a lesser contrast between its core 120 and substrate 124 and is thus a low-NA waveguide.

As part of the multimode section 126, the core 120 is doped with an ion 26 optically excitable and having a three-level optical transition when pumped at the pumped end of an optical cavity by the multimode pump source 72 at a pump wavelength for lasing at a signal wavelength different than the pump wavelength at the lasing end of the optical cavity provided by the uniform single-mode section 120. Preferably, the core is index-transformed or slightly tapered from the multimode end to the single mode end by the second transformer 138 such that the optically-active fiber is multimoded at the pump wavelength proximate to the multimode end of the second transformer 128, and is single moded at the signal wavelength proximate to the single mode end of the second transformer 128.

The first multimode grating or other types of mirror 60 is written or otherwise disposed on an input end of the high-NA waveguide portion 126 for defining an input end of the optical cavity 46. The single-mode grating or other types of mirror 62 is written or otherwise disposed on the low-NA waveguide portion 130 for defining a second end of the optical cavity 46. A second multimode grating 56 is written near the output end of the high-NA waveguide portion 126, either as an integral, spliced, or separate portion, for maximally reflecting power of the spatial modes at most wavelengths of the pump bandwidth propagated in the inner optical cavity 460.

The high-NA waveguide portions are embodied by the multimode cores that have a high aspect ratio, such as having the rectangular cross-sections 242 and 342. In contrast, the optional single mode output section 130 or the intervening single mode end-portion of the second transformer 128 forms the low-NA waveguide portion. Instead of a uniform step-transition of just using the grating or mirror 62 as a mode-selective filter between the multimode to single mode step transition of the multimode section 126 and the single mode section 130, the laser waveguide uses a slightly sloped or otherwise tapered mode-selective tapered second transformer 128 to adiabatically transform or otherwise couple the multimode to single mode.

Since one of the basic differences between a single-mode waveguide and a multimode waveguide is their cross-sectional area differences, the second mode transformer 128 can alternatively be implemented as anything that basically transitions or couples itself from a larger core cross-sectional area to a smaller core cross-sectional area to match the multimode to single mode.

In one embodiment of the invention, as seen in FIG. 1, the rectangular core having the input core cross-section 342, is employed to reduce the active area of the doped core of the multimode lasing section 126 without compromising the coupling efficiency between the pump diode 72 and the multimode section 126 by using the first transformer 118 to match the elliptically-shaped or near rectangular pump radiation or emission from the diode 72. Other input core cross-sections of other shapes, for example, elliptical or any other matching-beam shape, can be used to match the shape of the pump emission area, even though a linear is easier to implement than circular for planar geometry. However, it is desirable for the output of the waveguide laser to have a substantially circular mode field as its output cross-section in the single mode section 130. In telecommunication applications, for example, it is desirable for the output of the waveguide laser to have a substantially circular mode field because a conventional single mode fiber has a circular mode field and the better the mode field size and shape match, the lower the coupling loss. Even though the core can be of other shapes, the rectangular aspect is preferred for this waveguide laser application since the pump laser diode 72 also has a rectangular beam.

Instead of using planar geometry to form the second transformer 128 and the single mode portion 130 of the waveguide 30, fiber making processes can be used to form a separate component as the second transformer 128 to be connected with the rest of the planar waveguide and an output single mode fiber 20 of FIG. 4, in place of the single mode portion 130.

Referring to FIG. 4, one exemplary way to form the multimode section 426 of the second transformer 128' is illustrated. A rectangular core material 34 is placed within a cladding tube 36 which has a lower refractive index than the core's refractive index. Optionally, for extra stability or for further aspect ratio control, there can be provided an overclad tube, cane, sleeve, or jacket 360 made of the same cladding material as the first cladding tube or some other composition such that the overclad has a refractive index the same as the first cladding tube or lower to control the numerical aperture of the transformed fiber by building up more cladding material around the aperture or reduce the aperture, respectively. An exemplary composition of the optional overclad tube 360 is boron doped silica.

Since the core glass 34 is selected to be of a different material such that it is much softer than the pure silica cladding 36, the core glass 34 will be very fluid and conform to the geometry dictated by or conform to the cladding 36 when heated to the temperatures required to draw fiber and will slightly taper the resulting fiber into having a suitable output 40 for coupling to the single mode fiber 20. The shape of the core does not matter, it is more significant that the NA can be dropped and the shape can be made more circular with soft glass cores. The fluid core 34 will begin to dissolve the silica clad 36, lowering the refractive index of the core 34 and providing a better NA match to standard single-mode fibers 20 on the output end of the taper 340.

If the core is rectangular, the dissolution or glass mixing rate is faster in the direction of the minor axis due to mass transport constraints along the major axis. The core 34 can be initially made rectangular by starting with a cladding tube having a rectangular channel, groove, or other shaped aperture, inside the tube for depositing core cullets within.

Because the core is much softer than the cladding, the core will become a liquid during the tapering process in between sealed ends of the fiber. The thermal expansion of a liquid glass is two to three times that of a solid glass, causing the core to become pressurized. The hydrostatic pressure in the core will exert a force proportional to the area on which it acts. Hence the larger sides of a rectangular or elliptical core will experience a greater outward force pushing the sides into a more circular output cross-section. Thus the aspect ratio of a mode transforming or NA transforming taper can be reduced from the larger rectangular input cross-section 342 to the smaller circular output section 340, as the neckdown region 102 is drawn and the aspect ratio and NA of the core are both reduced by core diffusion/dissolution and expansion. More specifically, the taper or neckdown region 102 is made by heating a larger diameter section of the fiber to form a multimode section 426 and pulling it under tension. The tension is provided by another outer tube, outer cladding, or sleeve (housing or preform) surrounding the optional over-clad 360, or replacing it, through which the rectangular core-fiber 36 was originally inserted through so that it now surrounds and changes shape as the fiber 36 is heated and drawn to the desired configuration. Preferably, the material of the overclad tube or housing is made from the same or similar cladding material, such as boron doped silica.

Thus an initially rectangular multimode waveguide 342 can be transformed by tapering or otherwise coupling to a single-mode or a few-mode waveguide 40 of substantially circular geometry and with a reduced NA. This method has been successfully employed in transforming a rectangular core glass 34 of a multi-component silicate glass at the multimode rectangular input to an output mode closely matched to the CS980 single-mode fiber 20. Preferably, the multi-component silicate glass is $83.5SiO_2 9.8Al_2O_3 4.2 La_2O_3 2.5GeO_2+$ an appropriate rare-earth ion dopant (in mole %). Even though other single-mode fibers are usable, the single-mode fiber 20 is the CS980 single-mode fiber made by Corning, Inc. for propagating wavelengths at 980 nm and having a standard 125 micron diameter for the overall fiber.

Since the core is molten and the cladding is softening, diffusional processes are relatively fast, so graded index profiles can be created in situ. With appropriate choices of cladding material, the transformed fibers produced can be fusion spliced to conventional fibers making the transformed fibers quite practical in existing fiber networks and easing device manufacturing.

It will be apparent to those skilled in the art that various modifications and variations to the options and design criteria of the tapered waveguide laser structure can be made to the present invention without departing from the spirit and scope of the invention. For example, the planar geometry design of both the first and second mode adapters or transformers 118 and 128 and bragg gratings or mirrors 60, 56, and 62 will depend on the selection of the active ion 26 that will be lasing in the multimode lasing section 126 of FIG. 1.

For example, an Erbium (Er) eye-safe laser can be formed with the broad-area laser diode pumping at a pump wavelength from about 1490 to 1550 for lasing at the signal wavelength about 1600 nm where the actively doped ion is Er, in accordance with the teachings of the present invention.

Furthermore, it is noted that all of the structures described in connection with FIGS. 1 and 4 can be operated in an amplifier configuration by removing either of the end coatings of the facets of the resonator or laser structure. For example, in FIG. 1, the removal of either coating 80 from the end-facet of the broad-area diode 72 or coating that forms the reflector 56 would provide a device that would be a wavelength selective amplifier. This amplifier can be operated in either a single pass or a double pass configuration, depending on the specific application requirements.

Thus, it is intended that the present invention covers the modifications and variations of this invention provided they come within the scope of the appended claims and their equivalents.

What is claimed is:

1. An optical device, comprising:
   a broad area laser for lasing at a first wavelength;
   a multimode active-doped tapered waveguide laser having a first section having an input cross section having the same shape as an output cross section, the first section having an optically-active core cross section at an input end and at an output end for lasing at a second wavelength with an actively doped ion, and a second section having an input cross section being different from an output section, the second section tapering from the first section core cross section to a smaller output core cross section, wherein the multimode active-doped tapered waveguide laser has a multimode input reflector coupled to the input end of the first section before the second section, the multimode input reflector provides about 99% reflectivity for reflecting the fundamental-mode lasing output of the second wavelength, wherein the multimode active-doped tapered waveguide laser has a multimode output reflector coupled to the output end of the first section, the multimode output reflector provides about 99% reflectivity for reflecting about 99% of the first wavelength; and
   a multimode passive planar mode transformer coupling and tapering from the broad area laser to the multimode active-doped tapered waveguide laser.

2. The optical device of claim 1, wherein the broad area laser comprises a broad area laser diode (BALD) having about a 100×1 micrometer beam cross-section and a wavelength susceptible to excite the dopant of the active media of the multimode active-doped tapered waveguide laser.

3. An optical device, comprising:
   a broad area laser for lasing at a first wavelength;
   a multimode active-doped tapered waveguide laser; and
   a multimode passive planar mode transformer coupling and tapering from the broad area laser to the multimode active-doped tapered waveguide laser, wherein the multimode passive planar mode transformer has an input core cross section of about 100×3 micrometers and an output core cross section of about 15×3 micrometers for providing an anamorphic coupling element that reduces the input pump linear divergence in the "fast axis".

4. An optical device, comprising:
   a broad area laser for lasing at a first wavelength at about 915 nm as a pump wavelength;
   a multimode active-doped tapered waveguide laser; and
   a multimode passive planar mode transformer coupling and tapering from the broad area laser to the multimode active-doped tapered waveguide laser, wherein the multimode passive planar mode transformer has an input core cross section of about 100×3 micrometers and an output core cross section of about 15×3 micrometers for providing an anamorphic coupling element that reduces the input pump linear divergence in the "fast axis".

5. The optical device of claim 4, wherein the multimode active-doped tapered waveguide laser comprises a planar Yb-doped brightness converter.

6. The optical device of claim 4, wherein the multimode active-doped tapered waveguide laser comprises a planar brightness converter having an input core cross section of about 15×3 micrometers and an output core-cross section of about 3×3 micrometers.

7. The optical device of claim 6, wherein the planar brightness converter has a first planar section having a first section having an input cross section being the same as an output section, the first section having an optically-active core cross section of about 15×3 micrometers at an input end and at an output end for lasing at a second wavelength with an actively doped ion, and a second planar section having an input cross section different from an output section, the second section tapering from an input core cross section of about 15×3 micrometers to an output core cross section of about 3×3 micrometers.

8. The optical device of claim 7, wherein the planar brightness converter has a multimode input reflector coupled to the input end of the first planar section before the second planar section, the multimode input reflector provides about 99% reflectivity for reflecting the lasing output of the second wavelength.

9. The optical device of claim 8, wherein the planar brightness converter has a multimode output reflector coupled to the output end of the first planar section, the multimode output reflector provides about 99% reflectivity for reflecting about 99% of the first wavelength.

10. The optical device of claim 8, wherein the planar brightness converter has a single-mode reflector coupled to the output core of the second section for reflecting about 5–10% of the second wavelength.

11. The optical device of claim 10, wherein the first wavelength is about 915 nm, the second wavelength is about 980 nm, and the actively doped ion is Yb.

12. The optical device of claim 10, wherein the first wavelength is in a range between about 1480–1550 nm, the second wavelength is about 1600 nm, and the actively doped ion is Er.

13. The optical device of claim 4, wherein the multimode passive planar mode transformer comprises a first mode adapter.

14. The optical device of claim 7, wherein the second asymmetrical planar comprises a second mode adapter.

15. The optical device of claim 7, wherein the first planar section of the planar brightness converter has an active waveguide medium for three-level lasing with the actively doped ion.

16. The optical device of claim 8, wherein the multimode input reflector comprises a multimode Bragg grating.

17. The optical device of claim 8, wherein the multimode input reflector comprises a bulk mirror.

18. The optical device of claim 9, wherein the multimode output reflector comprise a multimode output grating for defining an inner laser cavity with a facet of the broad area laser.

19. The optical device of claim 10, wherein the single-mode reflector and the multimode input reflector comprise a pair of gratings for defining an outer laser cavity.

20. The optical device of claim 4, wherein the multimode active-doped tapered waveguide laser comprises a planar brightness converter having a multimode planar lasing member and a tapered fiber member.

* * * * *